United States Patent [19]

Takei et al.

[11] Patent Number: 5,985,701
[45] Date of Patent: Nov. 16, 1999

[54] PROCESS FOR FABRICATING LIQUID CRYSTAL ELECTRO-OPTICAL DEVICE COMPRISING COMPLEMENTARY THIN FILM FIELD EFFECT TRANSISTORS

[75] Inventors: Michiko Takei, Kanagawa; Tatsuya Ohori, Tokyo; Hongyong Zhang; Hideki Uochi, both of Kanagawa, all of Japan

[73] Assignee: Semiconductor Energy Labaratory Co., Ltd., Kanagawa-ken, Japan

[21] Appl. No.: 08/851,219

[22] Filed: May 5, 1997

[30] Foreign Application Priority Data

May 8, 1996 [JP] Japan .................................. 8-139458

[51] Int. Cl.⁶ .................... H01L 21/336; H01L 21/8238; H01L 21/84
[52] U.S. Cl. ...................... 438/154; 438/163; 438/305; 438/231; 438/595
[58] Field of Search ...................................... 437/154, 163, 437/303, 305, 595, 230, 231, FOR 155, FOR 184, FOR 201, FOR 396, FOR 397, FOR 494

[56] References Cited

U.S. PATENT DOCUMENTS

| 5,292,675 | 3/1994 | Codama . | |
|---|---|---|---|
| 5,508,209 | 4/1996 | Zhang et al. . | |
| 5,576,231 | 11/1996 | Konuma et al. . | |
| 5,592,008 | 1/1997 | Yamazaki et al. | 257/347 |
| 5,612,234 | 3/1997 | Ha . | |
| 5,619,045 | 4/1997 | Konuma et al. | 257/72 |
| 5,620,905 | 4/1997 | Konuma et al. | 438/163 |
| 5,648,277 | 7/1997 | Zhang et al. . | |
| 5,719,065 | 2/1998 | Takemura et al. . | |
| 5,736,414 | 4/1998 | Yamaguchi . | |
| 5,789,762 | 8/1998 | Koyama et al. | 257/66 |

*Primary Examiner*—Mary Wilczewski
*Attorney, Agent, or Firm*—Fish & Richardson P. C.

[57] ABSTRACT

A process reduced in mask steps for use in the fabrication of a thin film transistor having an LDD structure, comprising anodically oxidizing a gate electrode of a thin film transistor and performing ion implantation using the thus formed anodic oxide film as the mask. Also claimed is a similar process for fabricating a p-channel transistor and an n-channel transistor on a single substrate, comprising performing ion implantation of an impurity of the first conductive type to both of the transistor regions by using the anodic oxide film as a mask, and then performing ion implantation of an impurity of the second conductive type while masking one of the transistor regions with a resist.

10 Claims, 11 Drawing Sheets

PROCESS FOR FABRICATING LIQUID CRYSTAL ELECTRO-OPTICAL DEVICE COMPRISING COMPLEMENTARY THIN FILM FIELD EFFECT TRANSISTORS

BACKGROUND OF THE INVENTION

1. Field of the Invention

The present invention relates to a liquid crystal electro-optical (display) device, and particularly, to a liquid crystal electro-optical (display) device (referred to simply hereinafter as "LCD") comprising a thin film transistor formed on a glass substrate.

2. Description of the Related Art

Liquid crystal display devices are widely used as display devices of the so-called lap-top (notebook) type apparatus, i.e., portable type information processing apparatus. Recently, attempts are also made to use the LCD as a high resolution color display device for the so-called desktop type apparatus, i.e., the stand-alone type information processing apparatus.

In achieving such a high resolution color display with an LCD, the so-called active matrix-addressed (active matrix) liquid crystal display device which drives each of the pixels by the individually provided thin film transistor (referred to simply hereinafter as a "TFT") is used. By employing the active-matrix type driving method, excellent display characteristics can be achieved by eliminating problematic cross talks which occur among the pixels in the simple matrix method. In the active-matrix type driving method, the TFTs are provided on one of the glass substrates constituting the liquid crystal panel so that each of the TFTs may control the applied voltage of the corresponding transparent pixel electrode.

In the LCD driven by the active matrix method, TFTs are formed on amorphous glass substrate. Accordingly, differing from an ordinary transistor formed on a single crystal Si substrate, an amorphous silicon or a polycrystalline silicon, i.e., a so-called polysilicon, is used for the active portion of channel layer and the like of the TFT. Although polysilicon is more favorable for a TFT than amorphous silicon because the mobility of carriers is higher for the former as compared with that for the latter, it contains structural defects such as grain boundaries at a density substantially higher than single crystal silicon. As a result, polysilicon TFTs tend to suffer high leak current.

To minimize the leak current, many TFTs for LCDs employ the so-called LDD (Lightly Doped Drain) structure. By utilizing the LDD structure, the concentration of impurities in the drain region can be slightly lowered at the portion neighboring the channel region, and by then applying an electric field to such a portion of lowered impurity concentration, the focusing of electric field to the channel region is relaxed.

Figure 10A:
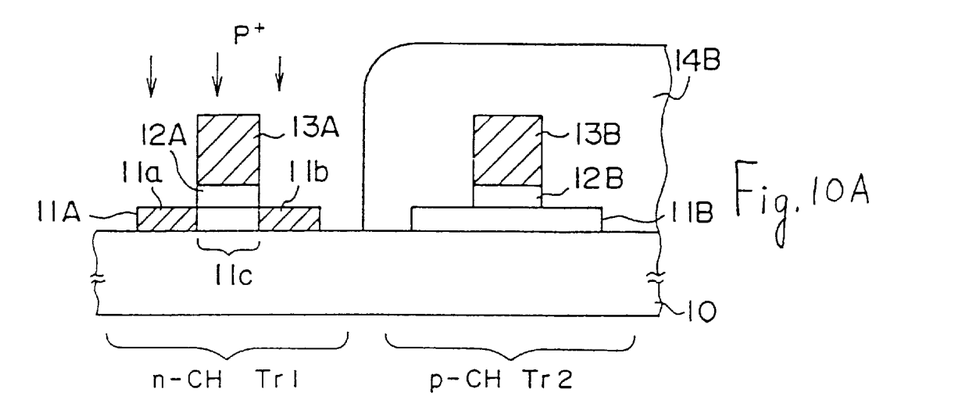
FIGS. 10A to 10C are an explanatory diagram showing the process steps for fabricating a conventional polysilicon TFT for an LCD.
Figure 10B:
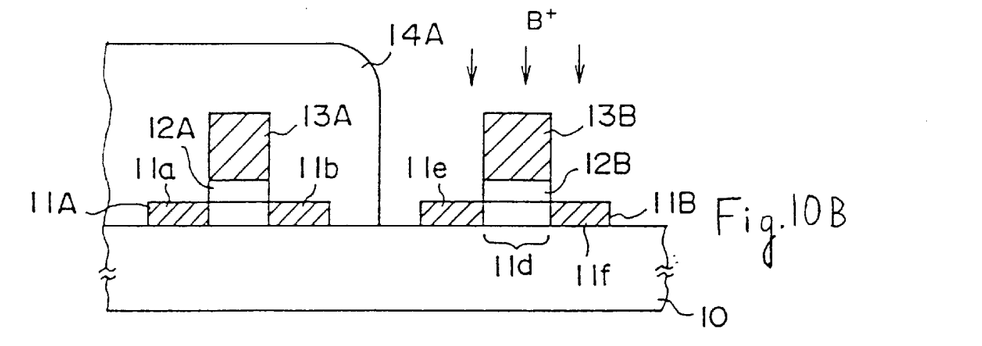
Figure 10C:
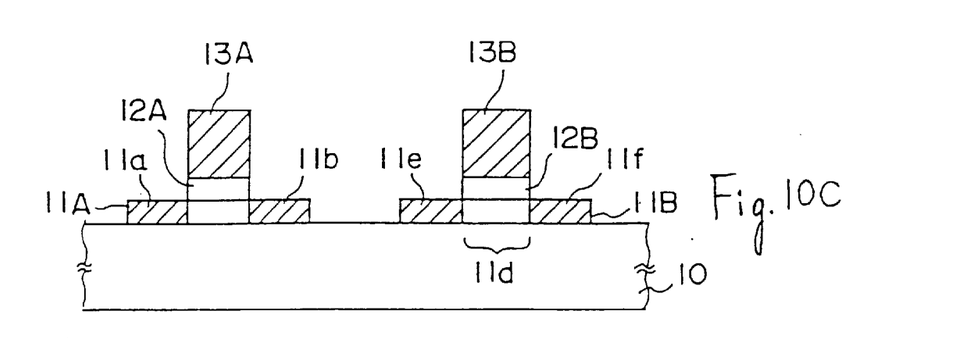

FIGS. 10A to 10C are diagrams showing the process steps for fabricating a conventional polysilicon TFT.

Referring to FIG. 10A, polysilicon patterns 11A and 11B are formed on a glass substrate 10 in correspondence with an n-channel transistor and a p-channel transistor, and gate patterns 13A and 13B are formed on the polysilicon patterns 11A and 11B with gate oxide films 12A and 12B interposed respectively therebetween. In the step with reference to FIG. 10A, the region for forming a p-channel transistor $Tr_2$ is protected by a resist 14B, and $P^+$ ions are implanted by using the gate electrode 13A as the mask. As a result, a channel region 11c corresponding to the gate electrode 13A sections the polysilicon pattern 11A so as to provide n-type regions 11a and 11b to form the source and drain regions of an n-channel transistor $Tr_1$.

Then referring to FIG. 10B, the resist 14B is removed, and another resist 14A is deposited in such a manner to cover the n-channel transistor $Tr_1$ formed in the step with reference to FIG. 10A. Then, $B^+$ ions are implanted into the resulting structure by using the gate electrode 13B as the mask. Thus, sectioned by a channel region lid just below the gate electrode 13B, p-type regions 11e and 11f are formed in the polysilicon pattern 11B.

After stripping off the resist 14A, heat treatment is applied to form a circuit comprising an n-channel transistor $Tr_1$ and a p-channel transistor $Tr_2$ on the glass substrate 10.

Figure 11A:
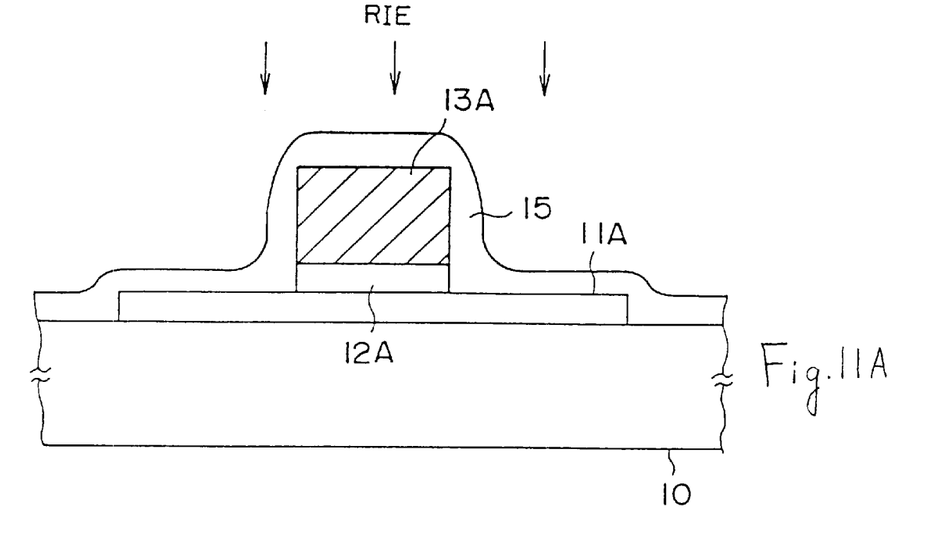
FIGS. 11A and 11B are an explanatory diagram showing the process steps for fabricating a conventional transistor having an LDD structure.
Figure 11B:
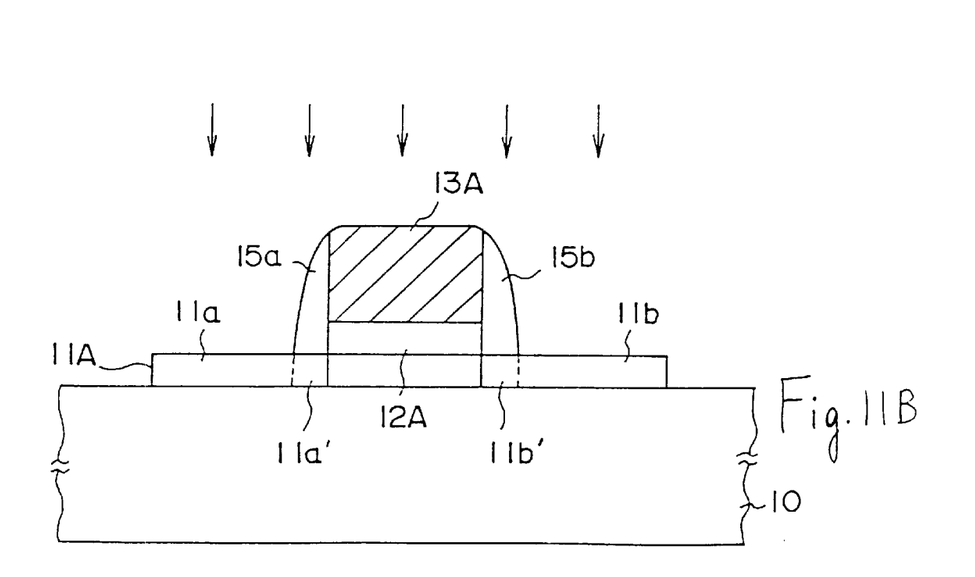

Conventionally, in case of forming the aforementioned LDD structure in an n-channel or a p-channel transistor above, for instance, a process with reference to FIG. 11A has been conventionally employed. More specifically, referring to FIG. 11A, an oxide film 15 is deposited on a previously formed transistor $Tr_1$, and anisotropic etching is applied from the upper side by means of RIE to form oxide films 15a and 15b on the side walls of the gate electrode as is shown in FIG. 11B. Then, by further implanting ions using the gate electrode having thereon the oxide films as a mask to form the heavily doped regions 11a and 11b, LDD regions 11a' and 11b' can be formed between the channel region and the region 11 and between the channel region and the region 11b. The same process is conducted for the p-channel transistor $Tr_2$. I n the conventional process for fabricating a TFT as described above with reference to FIGS. 10A and 10B, however, mask process must be performed twice. Moreover, the problem is that the mask used for implanting $P^+$ ions in the process of FIG. 10A cannot be removed easily. Although ashing for a considerably long duration of time is necessary to remove the resist, such a treatment may impose negative effects on the characteristics of the TFT formed on the glass substrate by a low temperature fabrication.

Furthermore, in case of forming an LDD structure on the TFT, it is necessary to perform a process comprising depositing an oxide film 15, and after performing anisotropic etching by means of RIE, implanting ions using the resulting side wall oxide films 15a and 15b as masks. Such a complicated process has been found problematic. It is possible to form an LDD structure using other masks instead of the side wall oxide films, but at the expense of incorporating an additional mask process.

SUMMARY OF THE INVENTION

In the light of the aforementioned circumstances, an object of the present invention is to overcome the aforementioned problems, and to provide a novel and useful process for fabricating a thin film transistor. More specifically, an object of the present invention is to provide a process for fabricating a thin film transistor having an LDD structure reduced in mask process steps.

Thus, according to an aspect of the present invention, there is provided a process for fabricating a semiconductor device having a gate electrode made of an anodically oxidizable metallic material, comprising:

forming an anodic oxide film on the side walls of a gate electrode by anodically oxidizing the gate electrode formed on a semiconductor layer;

forming a region of first electrically conductive type outside said anodic oxide film by introducing an impurity of the first electrically conductive type into said semiconductor layer having thereon said gate electrode, using said gate electrode and the anodic oxide film on the side walls thereof as masks; and further introducing said impurity of the first conductive type into said semiconductor layer by using said gate electrode as a mask after removing said anodic oxide film.

According to another aspect of the present invention, there is provided a process for fabricating a semiconductor device having a gate electrode made of an anodically oxidizable metallic material, comprising:

forming a gate electrode on a semiconductor pattern through a gate oxide film;

forming an anodic oxide film on the side walls of the gate electrode by anodically oxidizing said gate electrode;

etching said gate oxide film by using said gate electrode and said anodic oxide film as masks;

removing said anodic oxide film; and introducing an impurity of a first conductive type into said semiconductor pattern by using said gate electrode as a mask in such a manner that the portion covered by the gate oxide film is introduced at a first concentration, and that the portion not covered by said gate oxide film is introduced at a second concentration higher than the first concentration.

According to yet still another aspect of the present invention, there is provided a process for fabricating an LCD comprising an insulating substrate constituting a liquid crystal panel placed thereon a first gate electrode with a first transistor having a channel of a first conductive type and a second gate electrode with a second transistor having a channel of a second conductive type, comprising:

(a) a step of forming, by means of anodic oxidation, an anodic oxide film on the side walls of said first gate electrode;

(b) a step of forming, on the first semiconductor pattern on the substrate constituting an active portion of said first transistor, a region of first electrically conductive type outside said anodic oxide film by introducing an impurity of the first electrically conductive type, using said first gate electrode and the anodic oxide film on the side walls thereof as a mask;

(c) a step which is performed simultaneously with step (b), comprising forming, on the second semiconductor pattern on the substrate constituting an active portion of said second transistor, a region of first electrically conductive type outside said second gate electrode by introducing an impurity of the first electrically conductive type, using said second gate electrode as a mask;

(d) a step comprising, after removing said anodic oxide film, further introducing said impurity of the first conductive type into said first and second semiconductor patterns by using said first and second gate electrode as masks; and (e) a step of introducing an impurity of the second conductive type into said second semiconductor pattern by protecting said first transistor using a protective mask and by using said second electrode as a mask.

According to a still further aspect of the present invention, there is provided a process for fabricating an LCD comprising an insulating substrate constituting a liquid crystal panel placed thereon a first gate electrode with a first transistor having a channel of a first conductive type and a second gate electrode with a second transistor having a channel of a second conductive type, comprising:

(a) a step of forming a first gate electrode through a gate oxide film on a first semiconductor pattern on the substrate constituting an active portion of said first transistor;

(b) a step of forming an anodic oxide film on the side walls of said first gate electrode by means of anodic oxidation process;

(c) a step of etching said gate oxide film by using said gate electrode and said anodic oxide film as masks;

(d) a step of removing said anodic oxide film;

(e) a step of forming, on the first semiconductor pattern on the substrate constituting an active portion of said first transistor, a region of a first conductive type outside said anodic oxide film by introducing an impurity of the first electrically conductive type, using said first gate electrode as a mask;

(f) a step which is performed simultaneously with step (e), comprising forming, on the second semiconductor pattern on the substrate constituting an active portion of said second transistor, a region of first electrically conductive type outside said second gate electrode by introducing an impurity of the first electrically conductive type, using said second gate electrode as a mask; and (g) a step of introducing an impurity of the second conductive type into said second semiconductor pattern by protecting said first transistor using a protective mask and by using said second electrode as a mask.

Also according to a still further aspect of the present invention, there is provided a process for fabricating an LCD in accordance with the third and the fourth aspects above, wherein the step of introducing the impurity of the second conductive type is performed in such a manner that the impurity of the second conductive type is introduced into said second pattern at a concentration higher than that of the impurity of the first conductive type.

Also, according to a still further aspect of the present invention, there is provided a process for fabricating an LCD in accordance with the third and the fourth aspects above, wherein said first and second electrodes are made of aluminum, an aluminum alloy, or tantalum, and said anodic oxide film is formed on the side walls of said second electrode.

In accordance to the first and the third aspects described above, a TFT having an LDD structure can be fabricated by a considerably simplified process comprising performing ion implantation using gate electrodes having an anodically oxidized side wall as masks, and then further effecting ion implantation after removing the anodic oxide film. Because Al or an alloy thereof suitable for anodic oxidation is commonly used as the gate electrodes of the TFTs for an LCD, the present invention is particularly suitable for the fabrication of an LCD. The fourth aspect according to the present invention particularly simplifies the LCD fabrication process, because the number of masks for use in the formation of p-channel and n-channel TFTs can be reduced.

According to the second and the fourth aspects described above, another one of masks can be dispensed with in the formation of an TFT having an LDD structure, because the gate oxide film is etched by using the gate electrode having thereon an anodic oxide film as a mask and the anodic oxide film is removed subsequently thereafter.

Furthermore, according to the first and the second aspects of the present invention, an LDD structure can be easily implemented not only on the TFT for an LCD, but also on a common semiconductor device by using an anodically oxidizable metal such as Al, Al alloys, Ta, etc., for a gate electrode.

In accordance with the fifth aspect, a mask step can be omitted. Thus, even in case a region for forming a semiconductor device of a first conductive type should be doped to a second conductive type opposite to the first conductive type as a result of the first ion implantation, the region can be surely doped to the desired first conductive type in the later ion implantation step by using a mask and implanting an impurity of the first conductive type.

DETAILED DESCRIPTION OF THE PRESENT INVENTION

Figure 1A:
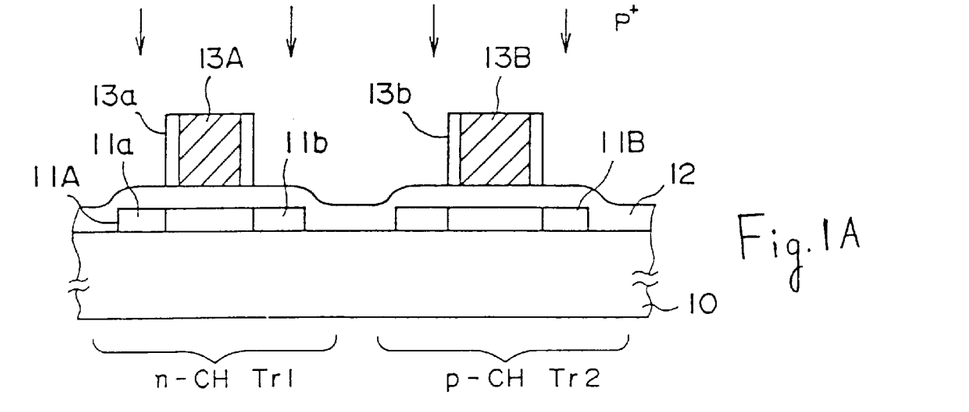
FIGS. 1A to 1C are an explanatory diagram showing the principle of the present invention.
Figure 1B:
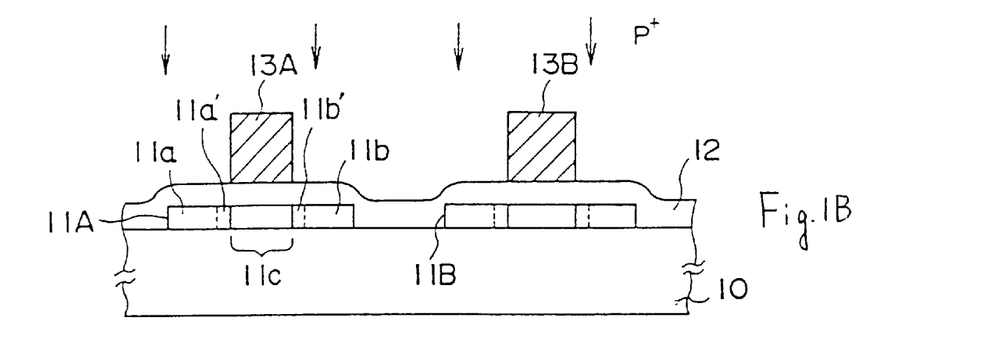
Figure 1C:
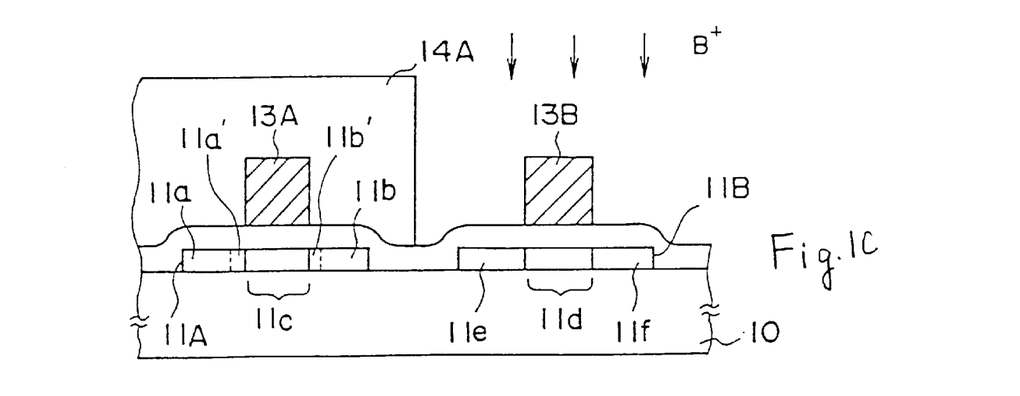

FIGS. 1A to 1C are an explanatory diagram showing the principle of the present invention.

Referring to FIGS. 1A to 1C, similar to the structure shown in FIG. 10A, a polysilicon pattern 11A which constitutes the active region of an n-channel transistor $Tr_1$ is formed on a glass substrate 10, and an aluminum (Al) pattern 13A is formed as a gate electrode on the polysilicon pattern 11A with a gate oxide film 12 interposed therebetween. Similarly, a polysilicon pattern 11B which constitutes the active region of a p-channel transistor $Tr_2$ is formed on the glass substrate 10, and an Al pattern 13B is formed as a gate electrode on the polysilicon pattern 11B with the gate oxide film 12 interposed therebetween.

In the step with reference to FIG. 1A, anodic oxide films 13a and 13b are formed on the side wall planes of the gate electrodes 13A and 13B by an anodic oxidation step, and ion implantation of $P^+$ ions and the like is performed by using the gate electrodes 13A and 13B having thereon the anodic oxide films as the masks. As a result, n-type regions 11a and 11b are formed on the outside of the anodic oxide film 13a in the polysilicon pattern 11A. In the process, the ion implantation on the transistors $Tr_1$ and $Tr_2$ are performed without using any resist masks in particular. Thus, similar n-type regions are formed inside the polysilicon pattern 11B.

Referring to FIG. 1B, the anodic oxide films 13a and 13b are removed, and $P^+$ ions are further implanted by using the gate electrodes 13A and 13B themselves as the masks. As a result, the n-type regions 11a and 11b are doped further to a higher concentration, and low impurity-concentration (lightly doped) regions 11a' and 11b' are formed inside the regions 11a and 11b in such a manner that the channel region 11c may be interposed therebetween. Similarly, low impurity-concentration regions are formed inside the polysilicon pattern 11B.

Referring to FIG. 1C, a p-type impurity, for instance $B^+$ ion, is introduced into the region of transistor $Tr_2$ by means of ion implantation after protecting the n-channel transistor $Tr_1$ by a resist mask 14A. Thus, as a result, p-type regions 11e and 11f are formed inside the polysilicon pattern 11B in such a manner that the channel region 11d may be interposed therebetween.

The process described above implements a transistor $Tr_1$ having a so-called LDD structure comprising lightly doped regions 11a' and 11b' formed between the channel region 11c and the diffusion regions 11a and 11b which function as source and drain regions, and is advantageous in circumventing an increase of leak current attributed to the electric field concentration to the channel region 11c. In the process according to the present invention, the LDD structure above can be formed very easily by using the anodic oxide film formed on the side walls of the Al electrode pattern 13A. Because low temperature treatment is necessary in forming a TFT on a glass substrate for use in an LCD, the gate electrode is formed by using aluminum which is applicable at low temperature, instead of using polysilicon, which is commonly used in ordinary MOS devices. Thus, the process for forming an LDD structure according to the present invention is particularly advantageous in the fabrication of LCDs.

Furthermore, the mask step in a conventional process as is shown in FIG. 10A can be omitted from the process steps in accordance with FIGS. 1A to 1C. Thus, the process according to the present invention can be considerably simplified. The mask step shown in FIG. 10A includes not only the formation of a resist mask 14B but also its removal. However, as is described hereinbefore, the removal of a resist implanted with P ions takes a long duration of time because its removal is tough. The process according to the present invention eliminates the resist removal step. Thus, as a result, the production throughput of the LCD can be greatly increased.

The present invention is described in further detail below referring to the preferred embodiments according to the present invention. It should be understood, however, that the present invention is not to be construed as being limited to the embodiments below.

Embodiment 1

FIGS. 2A to 2C and FIGS. 3D to 3F are an explanatory diagram of the process steps of fabricating a TFT on an LCD substrate according to the first embodiment according to the present invention.

Figure 2A:
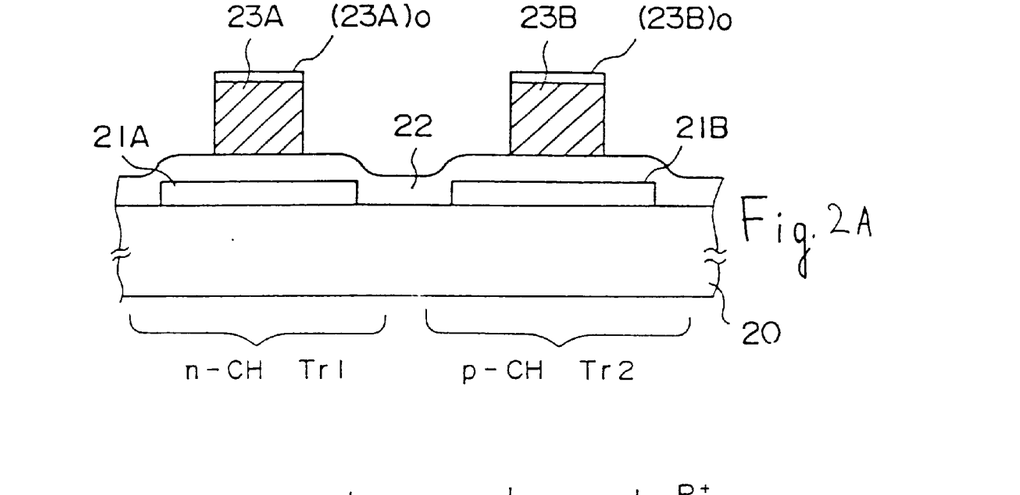
FIGS. 2A to 2C are the first part of an explanatory diagram showing the process according to the first embodiment of the present invention.

Referring to FIG. 2A, an amorphous silicon layer is formed by means of PCVD on a glass substrate 20 to a thickness of 50 nm at a temperature of 250° C. After converting the amorphous silicon layer into a polysilicon layer by applying heat treatment at 550° C. for a duration of 20 hours, patterning is performed to form polysilicon patterns 21A and 21B. Then, an $SiO_2$ film 22 is deposited to a thickness of 100 nm by means of PCVD in such a manner that it may cover the polysilicon patterns 21A and 21B, and a 400 nm thick Al layer is deposited further thereon by means of sputtering. The resulting structure is immersed into an electrolytic solution such as tartaric acid and the like, and electric current is applied thereto to form a dense oxide film on the surface of the Al layer to increase the adhesiveness of a resist to the Al layer. By patterning the Al layer thus covered with the oxide film, Al electrode patterns 23A and 23B carrying oxide films $(23A)_0$ and $(23B)_0$ are formed as is shown in FIG. 2A.

Figure 2B:
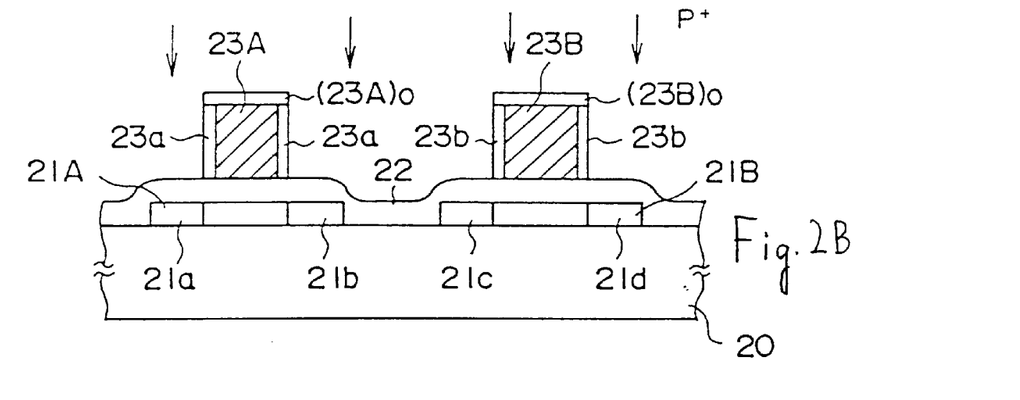

Then referring to FIG. 2B, the structure shown in FIG. 2A is immersed into an aqueous oxalic acid solution at about 30° C., and electric current is applied thereto for about 35 minutes to form side wall oxide films 23a and 23b comprising a relatively rough $Al_2O_3$ on the side walls of the electrode patterns 23A and 23B.

In the process shown in FIG. 2B, ion implantation of $P^+$ ions is performed after the anodic oxidation process above, by using the gate electrodes 23A and 23B as well as the side wall oxide films 23a and 23b as masks. Typically, the ion implantation is effected at an accelerating voltage of 80 keV and at a dose of $1\times10^{15}$ cm$^{-2}$ to form n-type regions 21a and 21b on the outer side of the polysilicon pattern 21A. Simultaneously, ion implantation is effected on the polysilicon pattern 21B for n-type doping the portions 21c and 21d on the outer side of the side wall oxide film 23b inside the polysilicon pattern 21B.

Figure 2C:
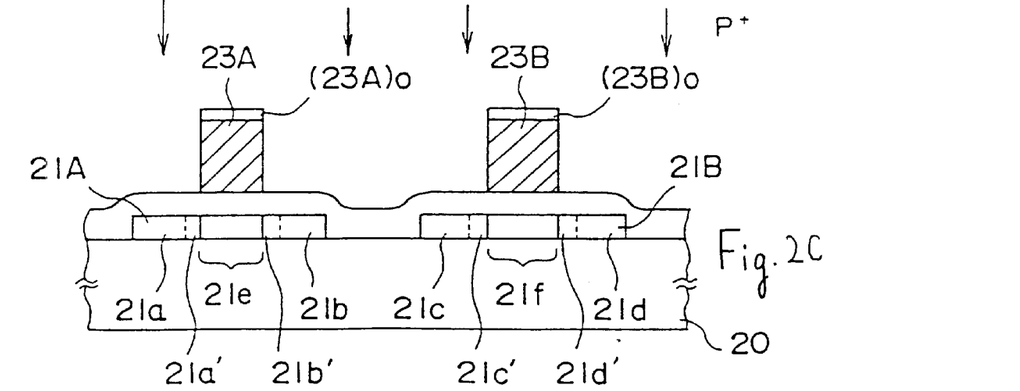

Then referring to FIG. 2C, the side wall oxide films 23a and 23b are removed by using an Al mixed acid at a temperature of 45° C. Ion implantation of $P^+$ ions is performed again thereafter to the polysilicon patterns 21A and 21B at an accelerating voltage of 70 keV and at a dose of $3\times10^{14}$ cm$^{-2}$. Thus are formed the lightly doped regions 21a' and 21b' on the inner side of the n-type regions 21a and 21b. That is, the lightly doped regions 21a' and 21b' are each formed inside the polysilicon pattern 21A, the former between the channel region 21e just under the gate electrode 23A and the n-type region 21a, and the latter between the channel region 21e and the n-type region 21b. Similarly, lightly doped regions 21c' and 21d' are each formed in the polysilicon pattern 21B, the former between the channel region 21f and the n-type region 21c, and the latter between the channel region 21f and the n-type region 21d.

As a result of the step with reference to FIG. 2C, an n-channel TFT $Tr_1$ is formed inside the polysilicon pattern 21A. In the step shown in FIG. 2C, a similar n-channel TFT is formed inside the polysilicon pattern 21B.

Figure 3D:
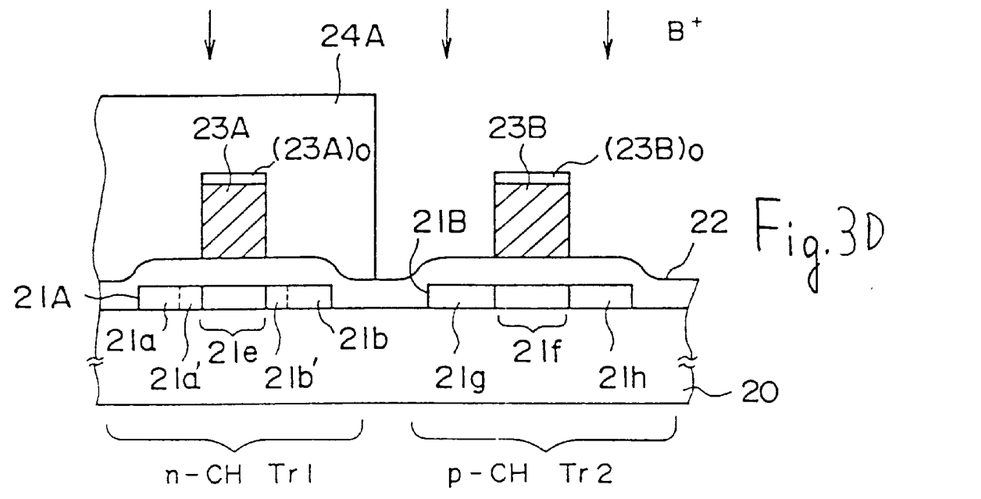
FIGS. 3D to 3F are the second part of an explanatory diagram showing the process according to the first embodiment of the present invention.

Referring to FIG. 3D, the n-channel TFT $Tr_1$ is protected by a resist pattern 24A, and ion implantation of $B^+$ ions is performed, typically at an accelerating voltage of 60 keV and at a dose of $3\times10^{15}$ cm$^{-2}$ to form p-type regions 21g and 21h in the polysilicon pattern 21B, except for the channel region 21f just below the gate electrode 23B. In the steps prior to the ion implantation step of FIG. 3D, the p-type region 21g and 21h were rendered n-type by the $P^+$ ions introduced in the previous steps with reference to FIGS. 2B and 2C. However, because the dose of ion implantation in the step of FIG. 3D is set higher than that in the previous ion implantation steps, the effect of the n-type impurities introduced previously is canceled out.

Figure 3E:
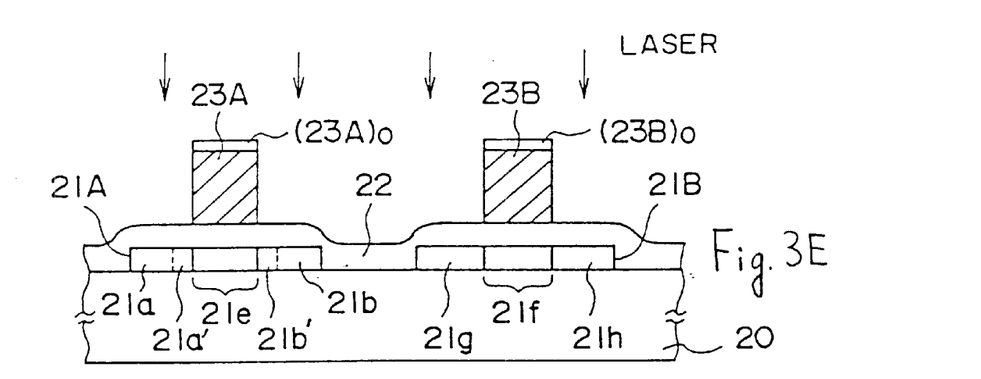

Next referring to FIG. 3E, the resist 24A is removed, and the resulting structure is annealed and the impurity introduced therein is activated by irradiating an XeCl excimer laser at an output energy of 400 mJ.

Figure 3F:
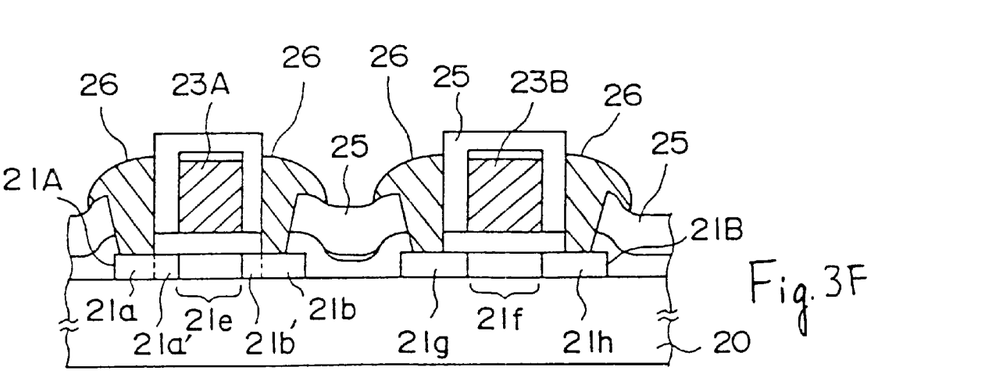

In the subsequent step with reference to FIG. 3F, an SiN film 25 is deposited on the structure shown in FIG. 3E, and an Al wiring pattern 26 is formed after forming a contact hole in the SiN film 25. Thus is obtained a structure comprising an LCD glass substrate having thereon a p-channel TFT and an n-channel TFT of an LDD structure.

Embodiment 2

A second embodiment is explained below with reference to FIGS. 4A and 4B as well as to FIGS. 5C to 5D and FIGS. 6E to 6G.

Figure 4A:
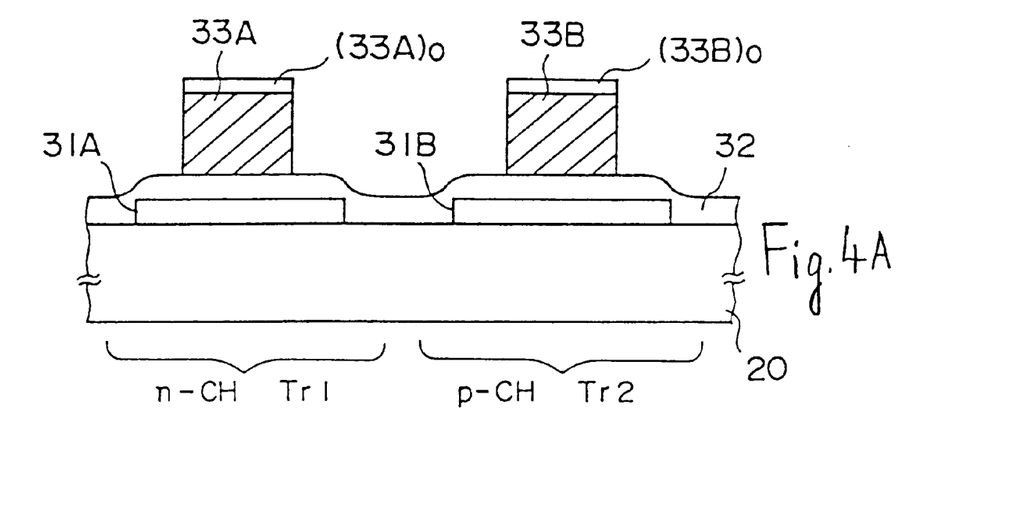
FIGS. 4A and 4B are the first part of an explanatory diagram showing the process according to the second embodiment of the present invention.

Referring to FIG. 4A, an amorphous silicon layer is formed by means of PCVD on a glass substrate 30 to a thickness of 50 nm at a temperature of 250° C. After converting the amorphous silicon layer into a polysilicon layer by applying heat treatment at 550° C. for a duration of 4 hours and irradiating a KrF excimer laser at an output energy of 600 mJ to thereby be crystallized, patterning is performed to form polysilicon patterns 31A and 31B. Then, an $SiO_2$ film 32 is deposited to a thickness of 150 nm by means of PCVD in such a manner that it may cover the polysilicon patterns 31A and 31B, and a 300 nm thick Al—Si alloy layer is deposited further thereon by means of sputtering. The resulting structure is immersed into an electrolytic solution such as tartaric acid and the like, and electric current is applied thereto to form a dense Al oxide film on the surface of the Al alloy layer by the anodic oxidation to increase the adhesiveness of a resist to the Al alloy layer. After applying a resist, Al electrode patterns 33A and 33B having oxide films $(33A)_0$ and $(33B)_0$ thereon are formed as is shown in FIG. 4A by patterning the Al alloy layer thus covered with the oxide film.

Figure 4B:
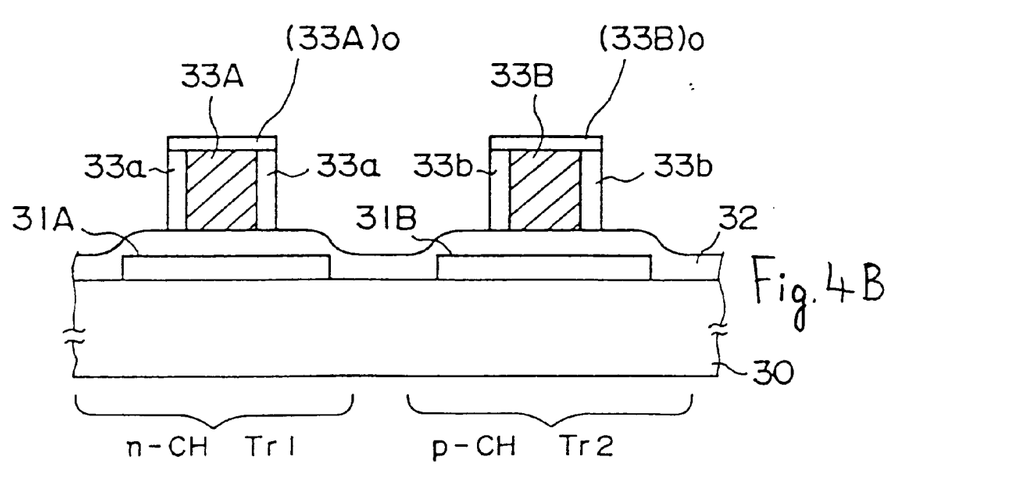

Then referring to FIG. 4B, the structure shown in FIG. 4A is immersed into an aqueous oxalic acid solution at about 30° C., and electric current is applied thereto for about 35 minutes to form side wall oxide films 33a and 33b comprising a relatively rough $Al_2O_3$ on the side walls of the electrode patterns 33A and 33B.

Figure 5C:
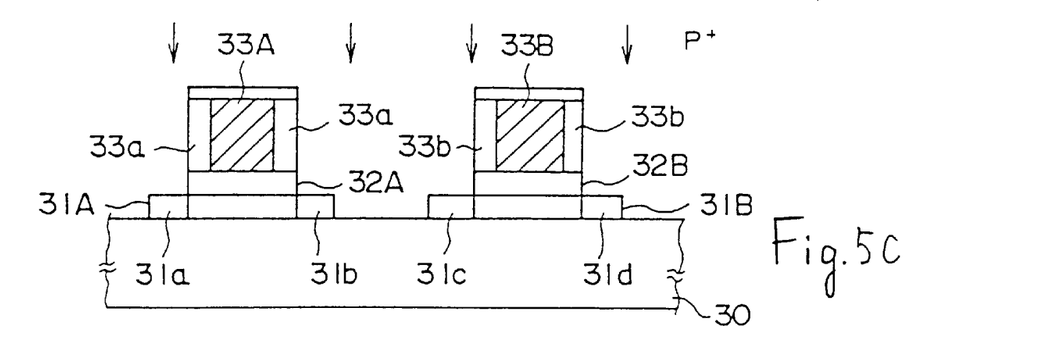
FIGS. 5C and 5D are the second part of an explanatory diagram showing the process according to the second embodiment of the present invention.

Then, in the step with reference to FIG. 5C, the $SiO_2$ film 32 is etched by means of dry etching by using electrode patterns 33A and 33B as well as the side wall oxide films 33a and 33b as masks. Thus, gate oxide film patterns 32A and 32B are formed in correspondence with the electrode patterns 33A and 33B.

In the process shown in FIG. 5C, ion implantation of $P^+$ ions is performed after the anodic oxidation process above, by using the gate electrodes 33A and 33B as well as the side wall oxide films 33a and 33b as masks. Typically, the ion implantation is effected at an accelerating voltage of 10 keV and at a dose of $1\times10^{15}$ cm$^{-2}$ to form n-type regions 31a and 31b on the outer side of the side wall oxide film 33a of the polysilicon pattern 31A. Simultaneously, the ion implantation is effected on the polysilicon pattern 31B for n-type doping the portions 31c and 31d on the outer portion of the side wall oxide film 33b inside the polysilicon pattern 31B.

Figure 5D:
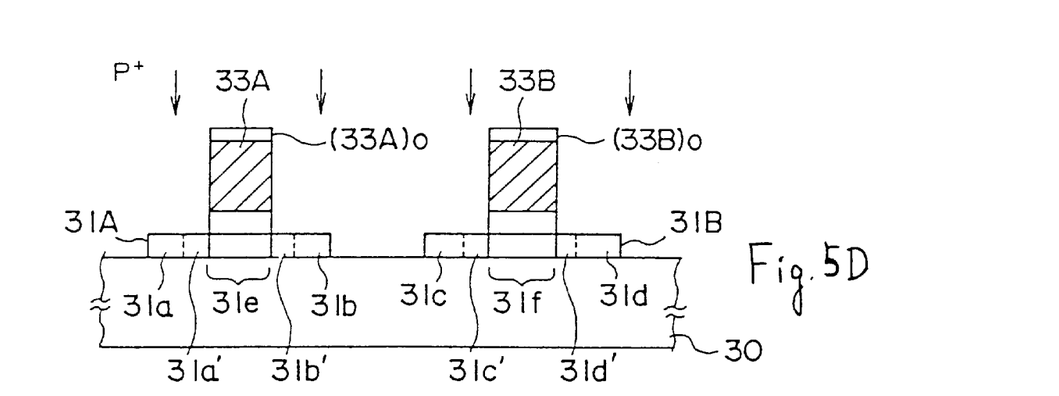

Then referring to FIG. 5D, the side wall oxide films 33a and 33b are removed by using an Al mixed acid at a temperature of 45° C. Thereafter, ion implantation of $P^+$ ions is performed again to the polysilicon patterns 31A and 31B at an accelerating voltage of 50 keV and at a dose of $3\times10^{14}$ cm$^{-2}$. Thus are formed the lightly doped n$^-$ type regions 31a' and 31b' on the inner side of the n-type regions 31a and 31b. That is, the lightly doped regions 31a' and 31b' are each formed inside the polysilicon pattern 31A, the former between the channel region 31e just under the gate electrode 33A and the n-type region 31a, and the latter between the channel region 31e and the n-type region 31b. Similarly, lightly doped regions 31c' and 31d' are each formed in the polysilicon pattern 31B, the former between the channel region 31f and the n-type region 31c, and the latter between the channel region 31f and the n-type region 31d.

As a result of the step with reference to FIG. 5D, an n-channel TFT $Tr_1$ is formed inside the polysilicon pattern 31A. In the step shown in FIG. 5D, a similar n-channel TFT is formed inside the polysilicon pattern 31B.

Figure 6E:
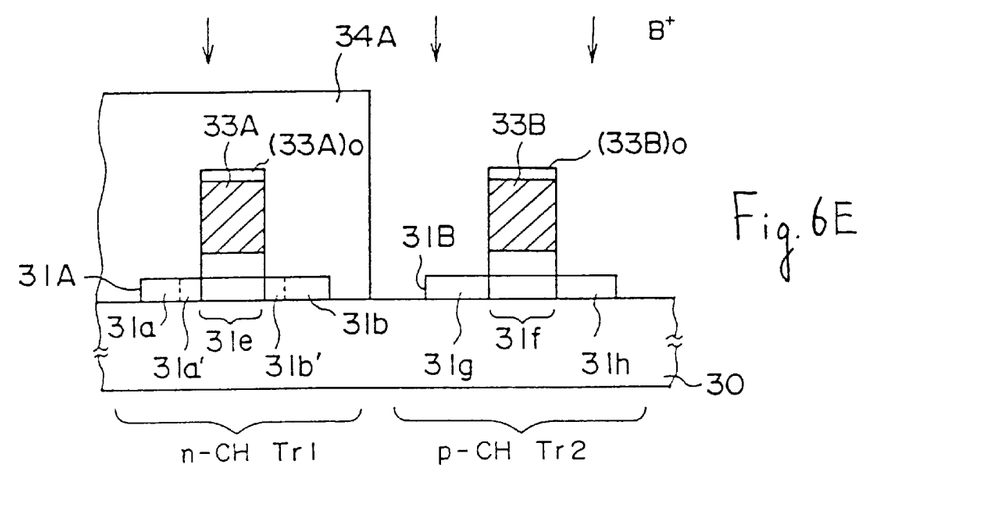
FIGS. 6E to 6G are the third part of an explanatory diagram showing the process according to the second embodiment of the present invention.

Referring to FIG. 6E, the n-channel TFT $Tr_1$ is protected by a resist pattern 34A, and ion implantation of $B^+$ ions is performed, typically at an accelerating voltage of 20 keV and at a dose of $3 \times 10^{15}$ cm$^{-2}$ to form p-type regions 31g and 31h in the polysilicon pattern 31B except for the channel region 31f just under the gate electrode 33B. In the steps prior to the ion implantation step of FIG. 6E, the p-type region 31g and 31h were rendered n-type by the $P^+$ ions introduced in the previous steps with reference to FIGS. 5C and 5D. However, because the dose of ion implantation in the step of FIG. 6E is set higher than that of ion implantation in the previous steps, the effect of the n-type impurities introduced previously is canceled out.

Figure 6F:
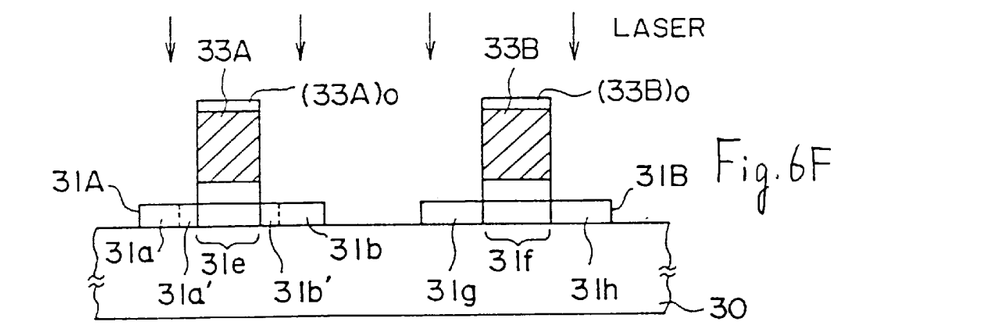

Next referring to FIG. 6F, the resist 34A is removed, and the resulting structure is annealed and the impurity introduced therein is activated by irradiating an XeCl excimer laser at an output energy of 350 mJ.

Figure 6G:
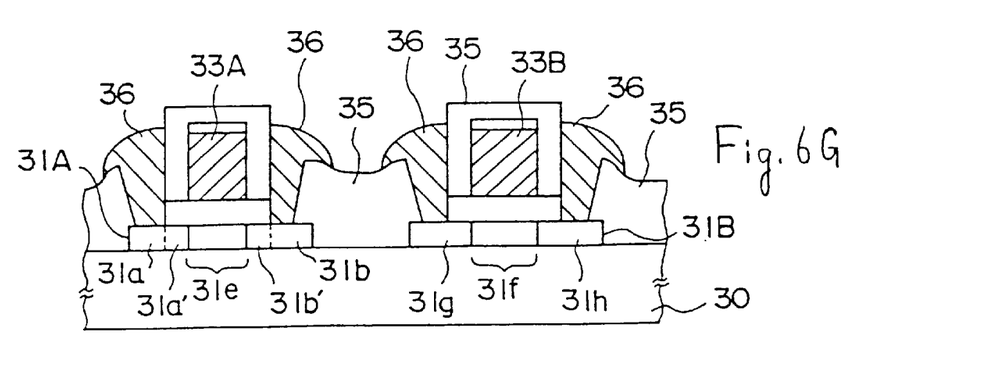

In the subsequent step with reference to FIG. 6G, an SiN film 35 is deposited on the structure shown in FIG. 6F, and an Al wiring pattern 36 is formed after forming a contact hole in the SiN film 35. Thus is obtained a structure comprising an LCD glass substrate having thereon a p-channel TFT and an n-channel TFT of an LDD structure.

Embodiment 3

A third embodiment is explained below with reference to FIGS. 7A and 7B as well as to FIGS. 8C to 8D and FIGS. 9E to 9G. It should be noted that the explanation for the portions corresponding to the same ones described in the previous embodiments is omitted, and these portions are referred by simply using the same reference symbol.

Figure 7A:
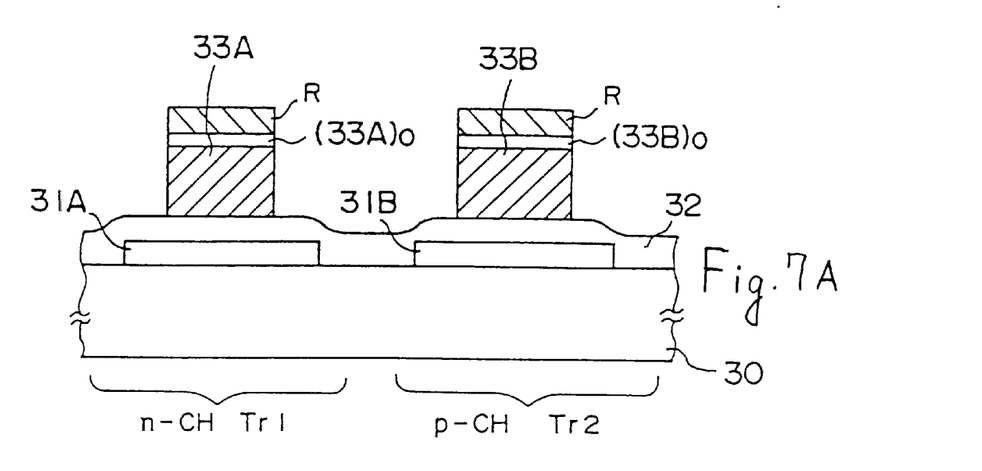
FIGS. 7A and 7B are the first part of an explanatory diagram showing the process according to the third embodiment of the present invention.

Referring to FIG. 7A, an amorphous silicon layer is formed by means of PCVD on a glass substrate 30 to a thickness of 80 nm, and is crystallized by applying heat treatment at 600° C. for a duration of 10 hours and irradiating an Ar laser to the entire surface of the film to thereby be converted into polysilicon layer. After thus converting the amorphous silicon layer, patterning is applied thereto to form polysilicon patterns 31A and 31B. Then, an $SiO_2$ film 32 is deposited to a thickness of 80 nm by means of PCVD in such a manner that it may cover the polysilicon patterns 31A and 31B, and a 350 nm thick Al—Sc alloy layer is deposited further thereon by means of sputtering. The resulting structure is immersed into an electrolytic solution such as tartaric acid and the like, and electric current is applied thereto to form a dense Al oxide film on the surface of the Al alloy layer by the anodic oxidation to increase the adhesiveness of a resist to the Al alloy layer. After applying a resist R, Al electrode patterns 33A and 33B each having oxide films $(33A)_0$ and $(33B)_0$ thereon are formed as is shown in FIG. 7A by patterning the Al alloy layer thus covered with the oxide film.

Figure 7B:
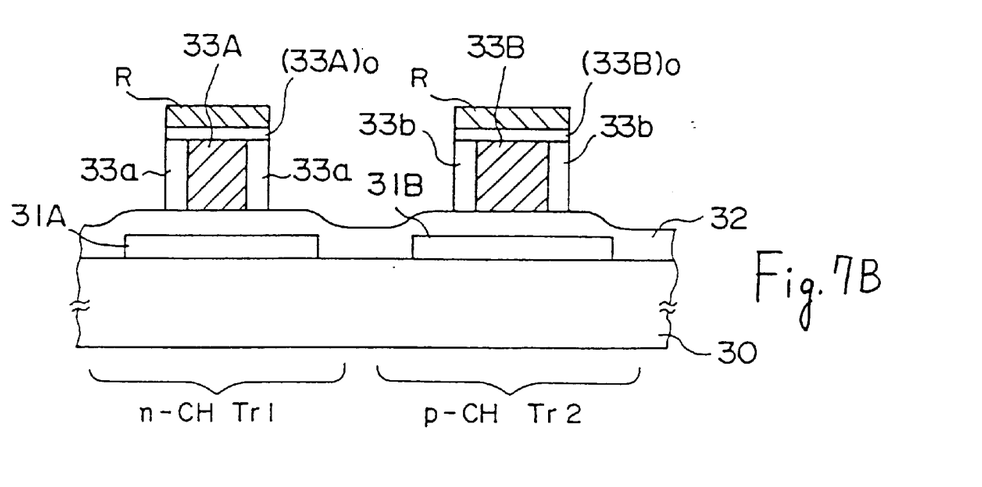

Then referring to FIG. 7B, the structure shown in FIG. 7A is immersed into an aqueous oxalic acid solution at about 30° C., and electric current is applied thereto for about 35 minutes to form side wall oxide films 33a and 33b comprising a relatively rough $Al_2O_3$ on the side walls of the electrode patterns 33A and 33B by the anodic oxidation. The resist R is stripped off thereafter.

Figure 8C:
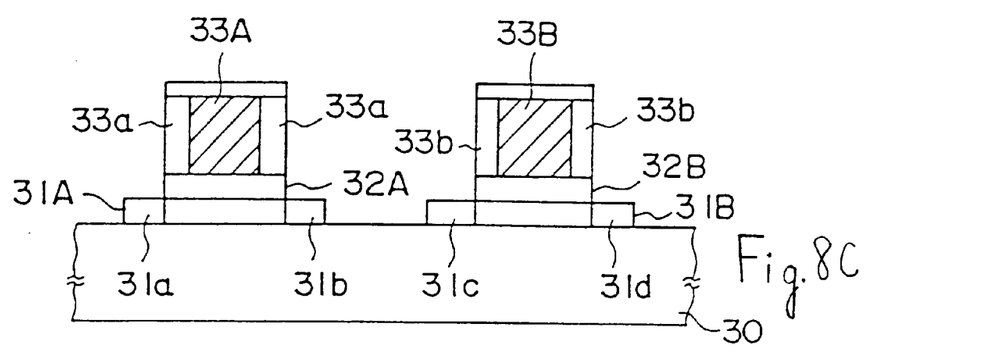
FIGS. 8C and 8D are the second part of an explanatory diagram showing the process according to the third embodiment of the present invention.

Then, in the step with reference to FIG. 8C, the $SiO_2$ film 32 is etched by using electrode patterns 33A and 33B as well as the side wall oxide films 33a and 33b as masks. Thus, gate oxide film patterns 32A and 32B are formed in correspondence with the electrode patterns 33A and 33B as well as the side wall oxide films 33a and 33b. The step shown in FIG. 8C differs from that shown in the previous embodiment in that ion implantation is not performed yet.

Figure 8D:
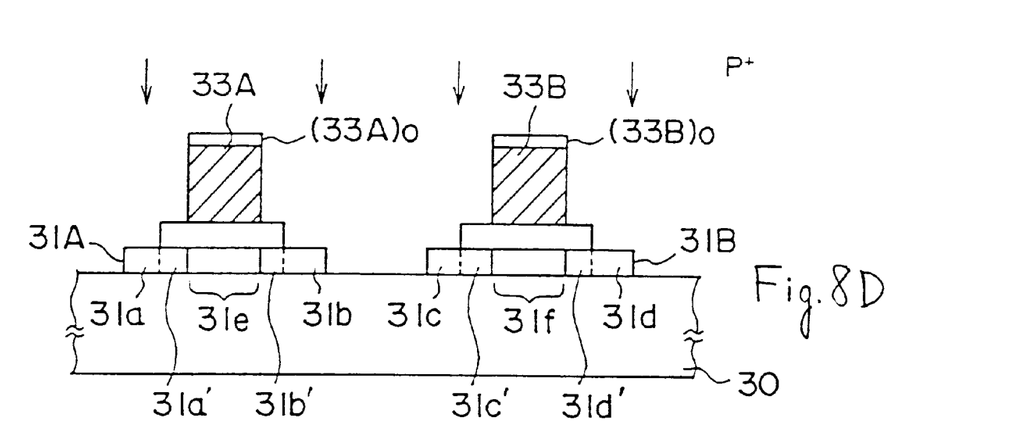

In the process shown in FIG. 8D, ion implantation of $P^+$ ions is performed after removing the side wall oxide films 33a and 33b by using an Al mixed acid at 45° C. The ion implantation is effected at an accelerating voltage of 40 keV and at a dose of $1 \times 10^{15}$ cm$^{-2}$ to form n-type regions 31a and 31b in the polysilicon pattern 31A. Simultaneously, the ion implantation is effected to form n$^-$-type lightly doped regions 31a' and 31b' inside the n-type regions 31a and 31b. Similarly, n-type regions 31c and 31d as well as lightly doped n$^-$-type regions 31c' and 31d' are formed in the polysilicon pattern 31B.

Figure 9E:
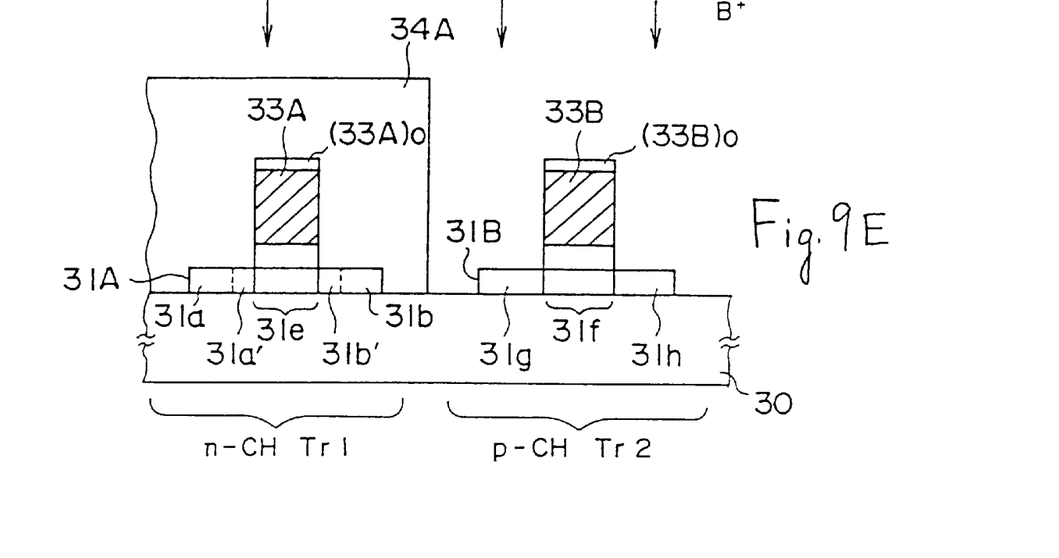
FIGS. 9E to 9G are the third part of an explanatory diagram showing the process according to the third embodiment of the present invention.
Figure 9F:
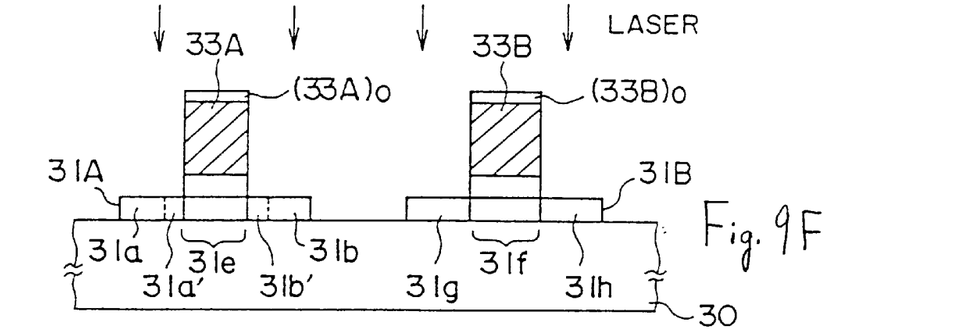
Figure 9G:
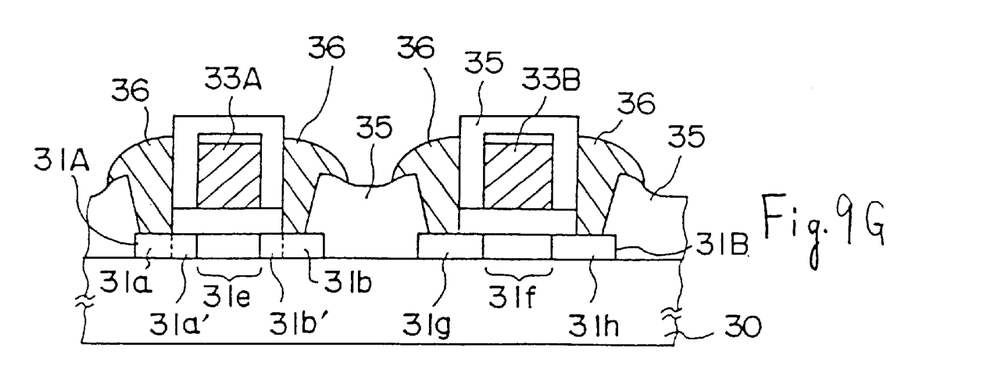

The description of the steps which follow the one with reference to FIG. 9E are substantially the same as those described referring to FIGS. 6E to 6G, and are therefore omitted.

As is described above, in the process according to the present invention, the ion implantation of $P^+$ ions is performed only once. Thus, the process steps can be reduced as compared with the prior art processes.

Although Al or an Al alloy is described as an anodically oxidizable gate electrode material in the explanation above, other anodically oxidizable materials such as Ta can be used as an alternative gate electrode material.

In the anodic oxidation process with reference to FIG. 2B or FIG. 4B, a denser anodic oxide film equivalent to an anodic oxide film $(23A)_0$ or $(23B)_0$ can be formed by continuing the anodic oxidation treatment after forming the coarse anodic oxide films 23a and 23b, or 33a and 33b. By forming the so-called barrier oxide film in this manner, the resistance of gate electrodes, such as 23A and 23B, can be increased in case of applying laser irradiation in the annealing step.

While the present invention has been described in detail and with reference to specific embodiments thereof, it will be apparent to one skilled in the art that various changes and modifications can be made therein without departing from the spirit and scope thereof.

What is claimed is:

1. A process for fabricating a liquid crystal electro-optical device comprising an insulating substrate constituting a liquid crystal panel placed thereon a first gate electrode with a first transistor having a channel of a first conductive type and a second gate electrode with a second transistor having a channel of a second conductive type, comprising:

(a) a step of forming, by means of anodic oxidation, an anodic oxide film on the side walls of said first gate electrode;

(b) a step of forming, on the first semiconductor pattern on the substrate constituting an active portion of said first transistor, a region of first electrically conductive type outside said anodic oxide film by introducing an impurity of the first electrically conductive type, using said first gate electrode and the anodic oxide film on the side walls thereof as a mask;

(c) a step which is performed simultaneously with step (b), comprising forming, on the second semiconductor pattern on the substrate constituting an active portion of said second transistor, a region of first electrically conductive type outside said second gate electrode by introducing an impurity of the first electrically conductive type, using said second gate electrode as a mask;

(d) a step comprising, after removing said anodic oxide film, further introducing said impurity of the first conductive type into said first and second semiconductor patterns by using said first and second gate electrodes as masks; and (e) a step of introducing an impurity of the second conductive type into said second semiconductor pattern by protecting said first transistor using a protective mask and by using said second electrode as a mask.

2. A process according to claim 1, wherein said first and second electrodes are made of aluminum, an aluminum alloy, or tantalum, and an anodic oxide film is formed on side walls of said second electrode.

3. A process according to claim 1, wherein the step of introducing the impurity of the second conductive type is performed in such a manner that the impurity of the second conductive type is introduced into said second pattern at a concentration higher than that of the impurity of the first conductive type.

4. A process according to claim 1, further comprising: a step of activating said impurity of the first electrically conductive type and said impurity of the second conductive type by a laser light.

5. A process according to claim 4, wherein the step of introducing the impurity of the second conductive type is performed in such a manner that the impurity of the second conductive type is introduced into said second pattern at a concentration higher than that of the impurity of the first conductive type.

6. A process for fabricating a liquid crystal electro-optical device comprising an insulating substrate constituting a liquid crystal panel placed thereon a first gate electrode with a first transistor having a channel of a first electrically conductive type and a second gate electrode with a second transistor having a channel of a second electrically conductive type, comprising:

(a) a step of forming a first gate electrode on a first semiconductor pattern on the substrate constituting an active portion of said first transistor with a gate oxide film between said first gate electrode and said first semiconductor pattern;

(b) a step of forming an anodic oxide film on the side walls of said first gate electrode by means of anodic oxidation process;

(c) a step of etching said gate oxide film by using said first gate electrode and said anodic oxide film as masks;

(d) a step of removing said anodic oxide film;

(e) a step of forming, on the first semiconductor pattern on the substrate constituting an active portion of said first transistor, a region of the first electrically conductive type outside said anodic oxide film by introducing an impurity of the first electrically conductive type, using said first gate electrode as a mask;

(f) a step which is performed simultaneously with step (e), comprising forming, on a second semiconductor pattern on the substrate constituting an active portion of said second transistor, a region of the first electrically conductive type outside said second gate electrode by introducing an impurity of the first electrically conductive type, using said second gate electrode as a mask; and (g) a step of introducing an impurity of the second electrically conductive type into said second semiconductor pattern by protecting said first transistor using a protective mask and by using said second electrode as a mask.

7. A process according to claim 6, wherein said first and second electrodes are made of aluminum, an aluminum alloy, or tantalum, and an anodic oxide film is formed on side walls of said second electrode.

8. A process according to claim 6, wherein the step of introducing the impurity of the second conductive type is performed in such a manner that the impurity of the second conductive type is introduced into said second pattern at a concentration higher than that of the impurity of the first conductive type.

9. A process according to claim 6, further comprising:

a step of activating said impurity of the first electrically conductive type and said impurity of the second conductive type by a laser light.

10. A process according to claim 9, wherein the step of introducing the impurity of the second conductive type is performed in such a manner that the impurity of the second conductive type is introduced into said second pattern at a concentration higher than that of the impurity of the first conductive type.

* * * * *